(12) United States Patent
Wei et al.

(10) Patent No.: US 9,608,086 B2
(45) Date of Patent: Mar. 28, 2017

(54) METAL GATE STRUCTURE AND METHOD OF FORMATION

(71) Applicant: GLOBALFOUNDRIES Inc., Grand Cayman (KY)

(72) Inventors: Andy Chih-Hung Wei, Queensbury, NY (US); Dae G. Yang, Watervliet, NY (US); Mariappan Hariharaputhiran, Ballston Lake, NY (US); Jing Wan, Malta, NY (US)

(73) Assignee: GLOBAL FOUNDRIES INC., Grand Cayman (KY)

( * ) Notice: Subject to any disclaimer, the term of this patent is extended or adjusted under 35 U.S.C. 154(b) by 49 days.

(21) Appl. No.: 14/282,257

(22) Filed: May 20, 2014

(65) Prior Publication Data
US 2015/0340461 A1    Nov. 26, 2015

(51) Int. Cl.
*H01L 21/336* (2006.01)
*H01L 29/66* (2006.01)
*H01L 29/78* (2006.01)

(52) U.S. Cl.
CPC ........ *H01L 29/66545* (2013.01); *H01L 29/66* (2013.01); *H01L 29/785* (2013.01)

(58) Field of Classification Search
CPC ........................... H01L 29/66545; H01L 29/66
USPC ........................... 257/E21.444; 438/167, 279
See application file for complete search history.

(56) References Cited

U.S. PATENT DOCUMENTS

| | | | |
|---|---|---|---|
| 2005/0156171 A1* | 7/2005 | Brask | H01L 21/823821 257/72 |
| 2011/0147831 A1 | 6/2011 | Steigerwald et al. | |
| 2011/0156107 A1* | 6/2011 | Bohr | H01L 21/76831 257/288 |
| 2013/0183835 A1* | 7/2013 | Nguyen | C23C 16/345 438/793 |
| 2013/0248952 A1* | 9/2013 | Rosenbaum | H01L 29/66545 257/288 |
| 2014/0038402 A1 | 2/2014 | Wei et al. | |

* cited by examiner

*Primary Examiner* — Robert Huber
(74) *Attorney, Agent, or Firm* — Williams Morgan, P.C.

(57) ABSTRACT

Embodiments of the present invention provide a metal gate structure and method of formation. In the replacement metal gate (RMG) process flow, the gate cut process is performed after the metal gate is formed. This allows for a reduced margin between the end of the gate and an adjacent fin. It enables a thinner sacrificial layer on top of the dummy gate, since the gate cut step is deferred. The thinner sacrificial layer improves device quality by reducing the adverse effect of shadowing during implantation. Furthermore, in this process flow, the work function metal layer is terminated along the semiconductor substrate by a capping layer, which reduces undesirable shifts in threshold voltage that occurred in prior methods and structures.

9 Claims, 7 Drawing Sheets

METAL GATE STRUCTURE AND METHOD OF FORMATION

FIELD OF THE INVENTION

The present invention relates generally to semiconductor fabrication, and more particularly, to a metal gate structure and method of formation.

BACKGROUND

As technology dimensions scale for fin type field effect transistors (finFETs), the gate end region beyond the fin (gate endcap) and layer thicknesses for gate cap and spacers need to scale accordingly. However, as critical dimensions get smaller, these features create challenges that can adversely impact circuit density, product yield, and device variability. It is therefore desirable to have improvements in metal gate structures and methods of formation.

SUMMARY

Embodiments of the present invention provide a metal gate structure and method of formation. In the replacement metal gate (RMG) process flow, the gate cut process is performed after the metal gate is formed. This allows for a reduced margin between the end of the gate and an adjacent fin. It enables a thinner sacrificial layer on top of the dummy gate, since the gate cut step is deferred. The thinner sacrificial layer improves device quality by reducing the adverse effect of shadowing during implantation. Furthermore, in this process flow, the work function metal layer is terminated along the semiconductor substrate by a capping layer, which reduces undesirable shifts in threshold voltage that occurred in prior methods and structures.

In a first aspect, embodiments of the present invention provide a method of forming a semiconductor structure, comprising: forming a dummy gate on a semiconductor substrate; depositing a sacrificial layer on the dummy gate; forming spacers adjacent to the dummy gate; removing the dummy gate and sacrificial layer; depositing a work function metal layer; depositing a fill metal layer; performing a gate cut; and depositing a gate capping layer.

In a second aspect, embodiments of the present invention provide a semiconductor structure, comprising: a semiconductor substrate; a fin formed on the semiconductor substrate; a gate stack formed over the fin, wherein the gate stack comprises: a work function metal layer disposed on the fin; a metal fill layer disposed on the work function metal layer; and a capping layer disposed on a top and side portions of the gate stack, wherein the work function metal layer terminates at the capping layer on the semiconductor substrate.

In a third aspect, embodiments of the present invention provide a semiconductor structure, comprising: a semiconductor substrate; a fin formed on the semiconductor substrate; a gate stack formed over the fin, wherein the gate stack comprises: a work function metal layer disposed on the fin; a metal fill layer disposed on the work function metal layer; and a capping layer disposed on a top and side portions of the gate stack, wherein the work function metal layer terminates at the capping layer on the semiconductor substrate, and wherein the capping layer disposed on the side portions of the gate stack is disposed at a distance from the fin ranging from about 5 nanometers to about 15 nanometers.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
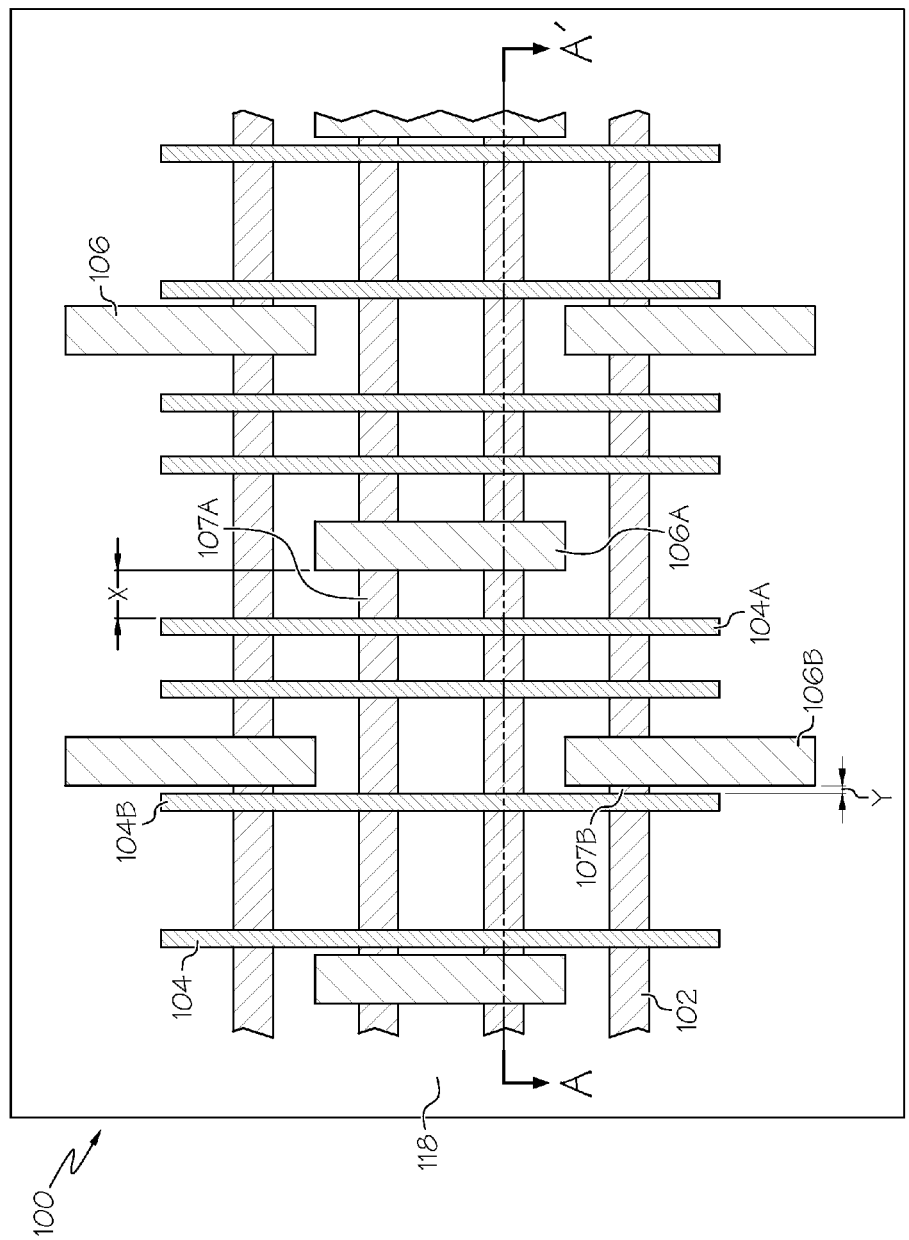

Often, similar elements may be referred to by similar numbers in various figures (FIGs) of the drawing, in which case, typically the last two significant digits may be the same, the most significant digit being the number of the drawing figure (FIG). Furthermore, for clarity, some reference numbers may be omitted in certain drawings.

FIG. 1 shows a top-down view of a semiconductor structure in accordance with embodiments of the present invention.

Figure 2:
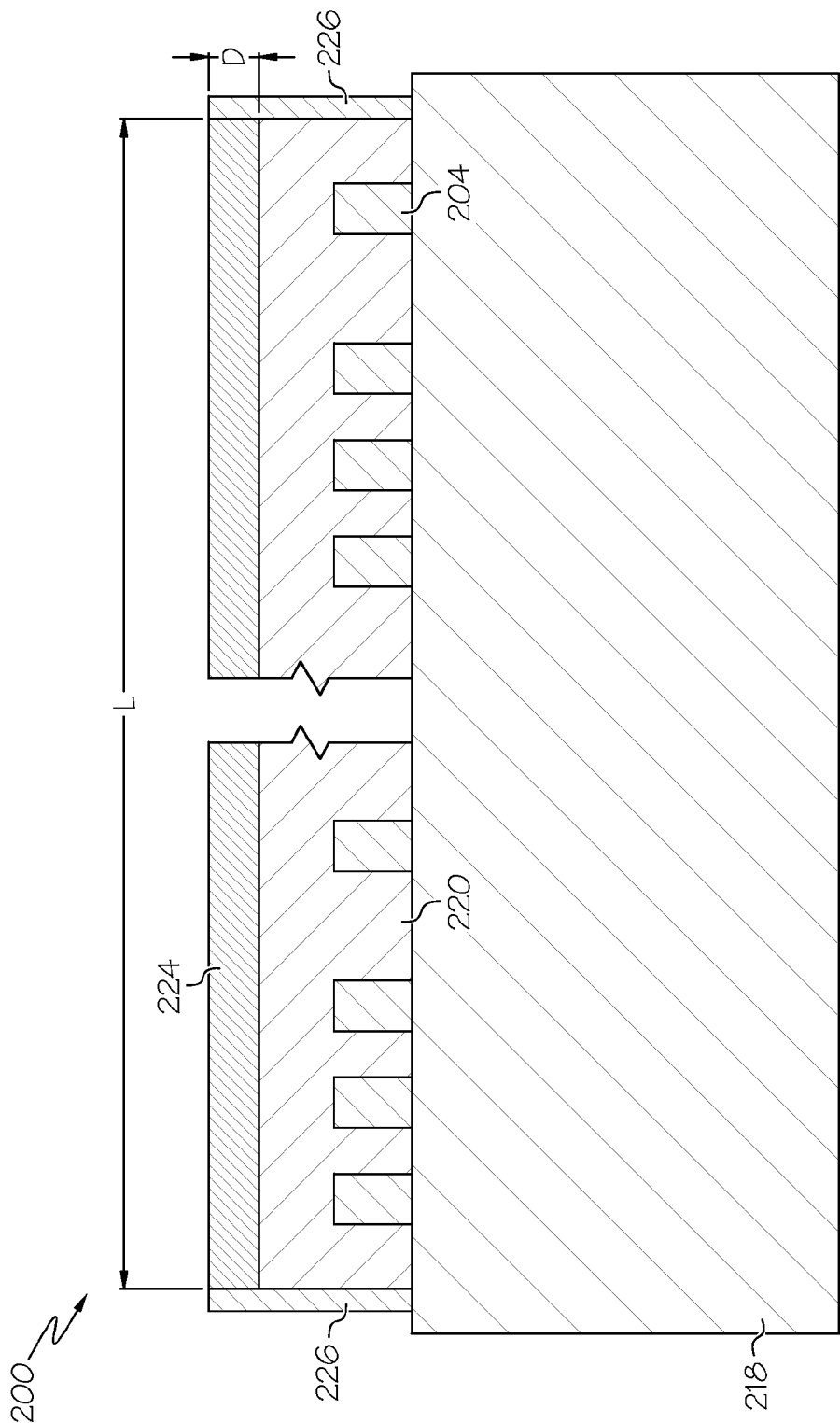

FIG. 2 shows a side view of a semiconductor structure at a starting point for embodiments of the present invention.

Figure 3A:
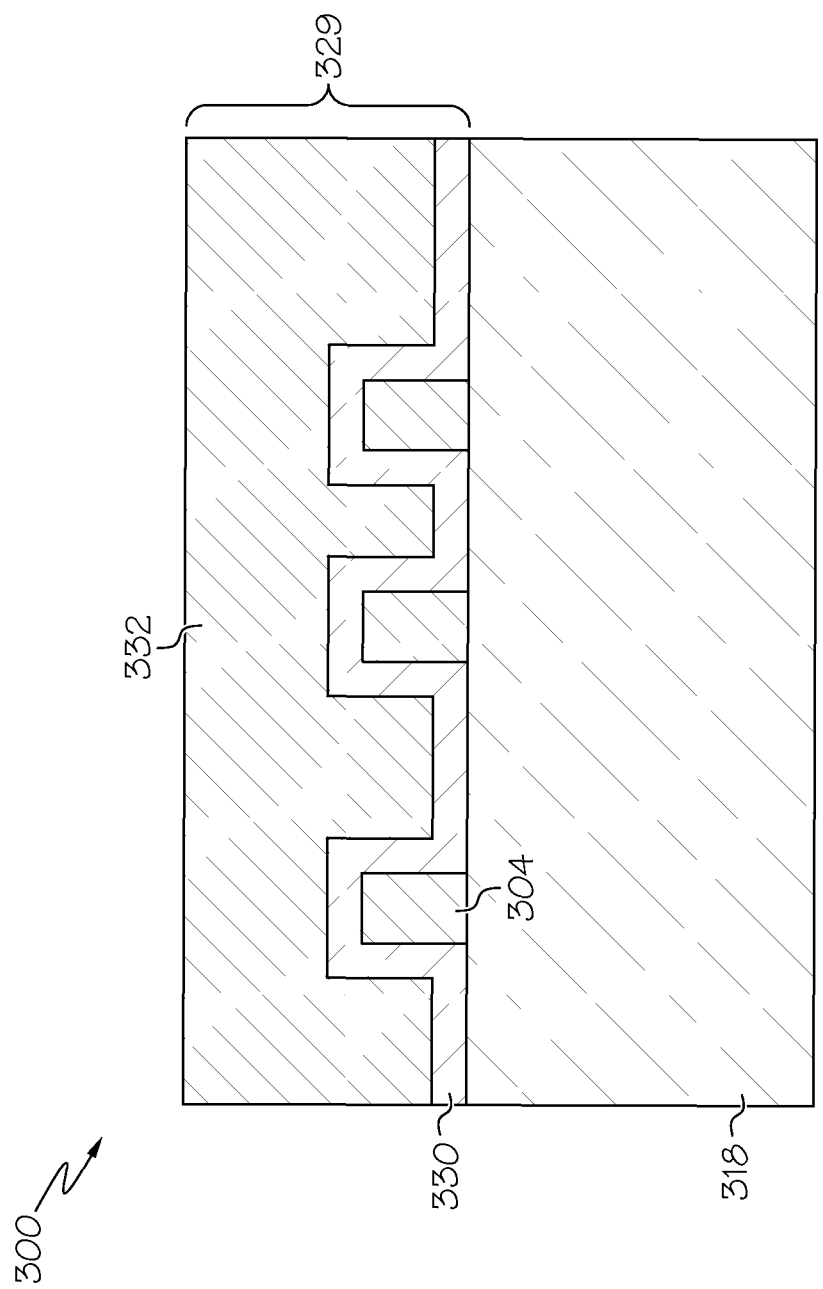

FIG. 3A shows a side view of a semiconductor structure after subsequent process steps of depositing a work function metal layer and a metal gate layer in accordance with illustrative embodiments.

Figure 3B:
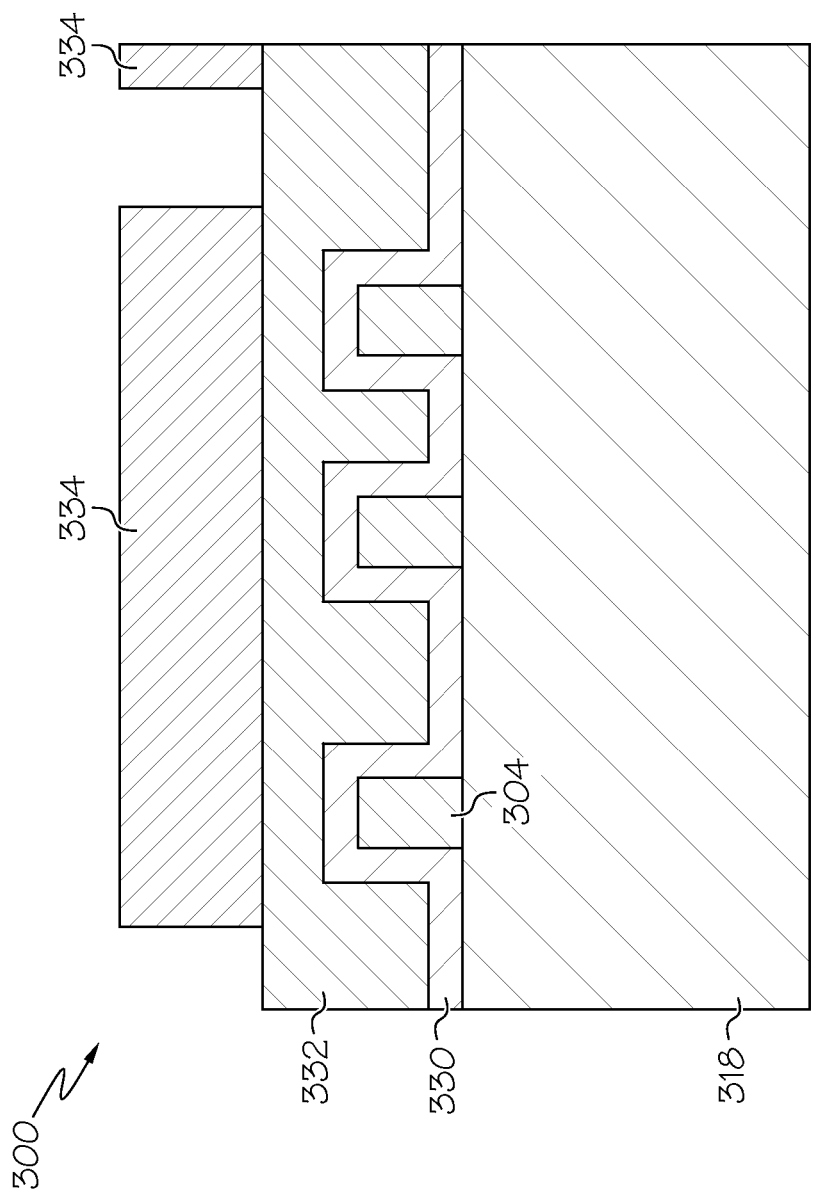

FIG. 3B shows a side view of a semiconductor structure after a subsequent process step of forming a gate cut mask in accordance with illustrative embodiments.

Figure 3C:
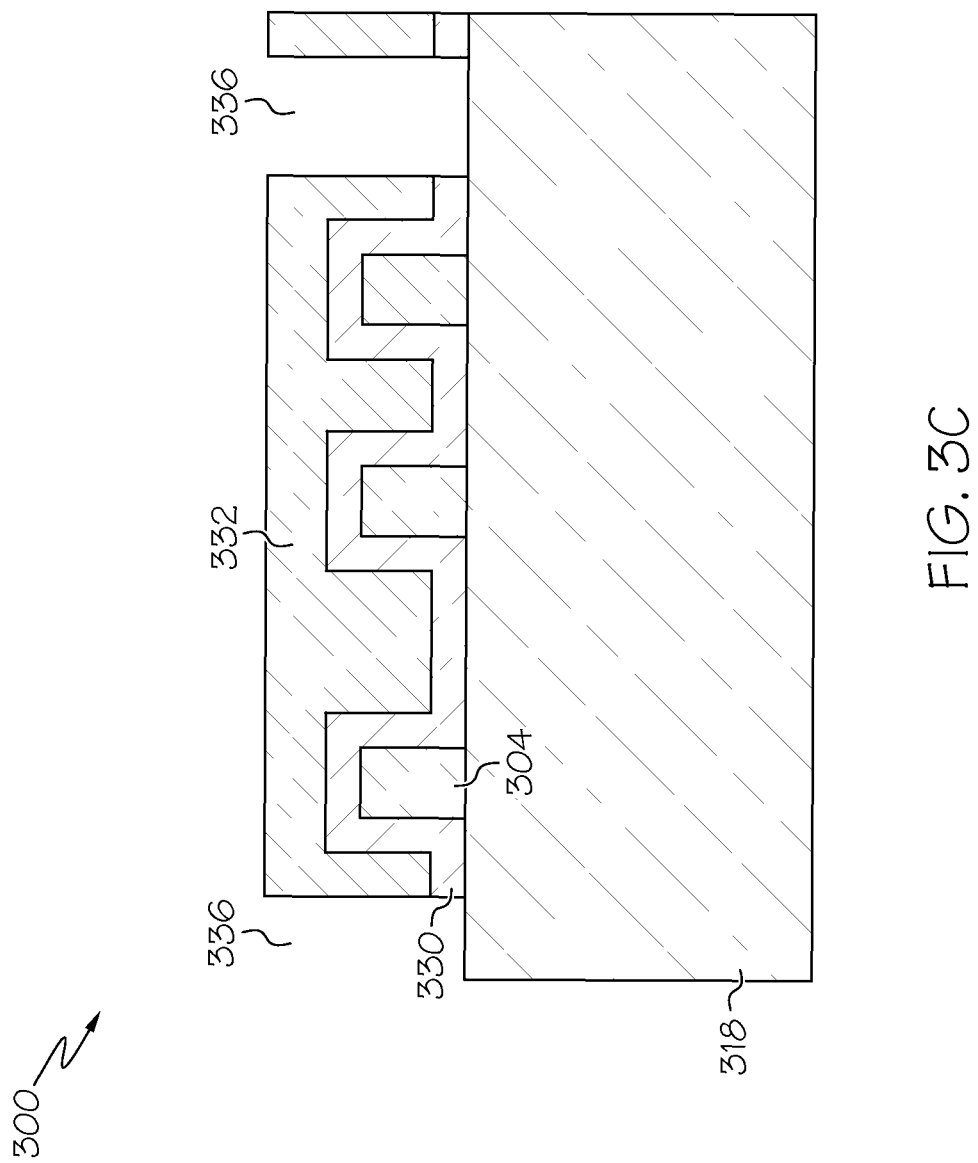

FIG. 3C shows a side view of a semiconductor structure after subsequent process steps of performing a gate cut and work function metal recess in accordance with illustrative embodiments.

Figure 3D:
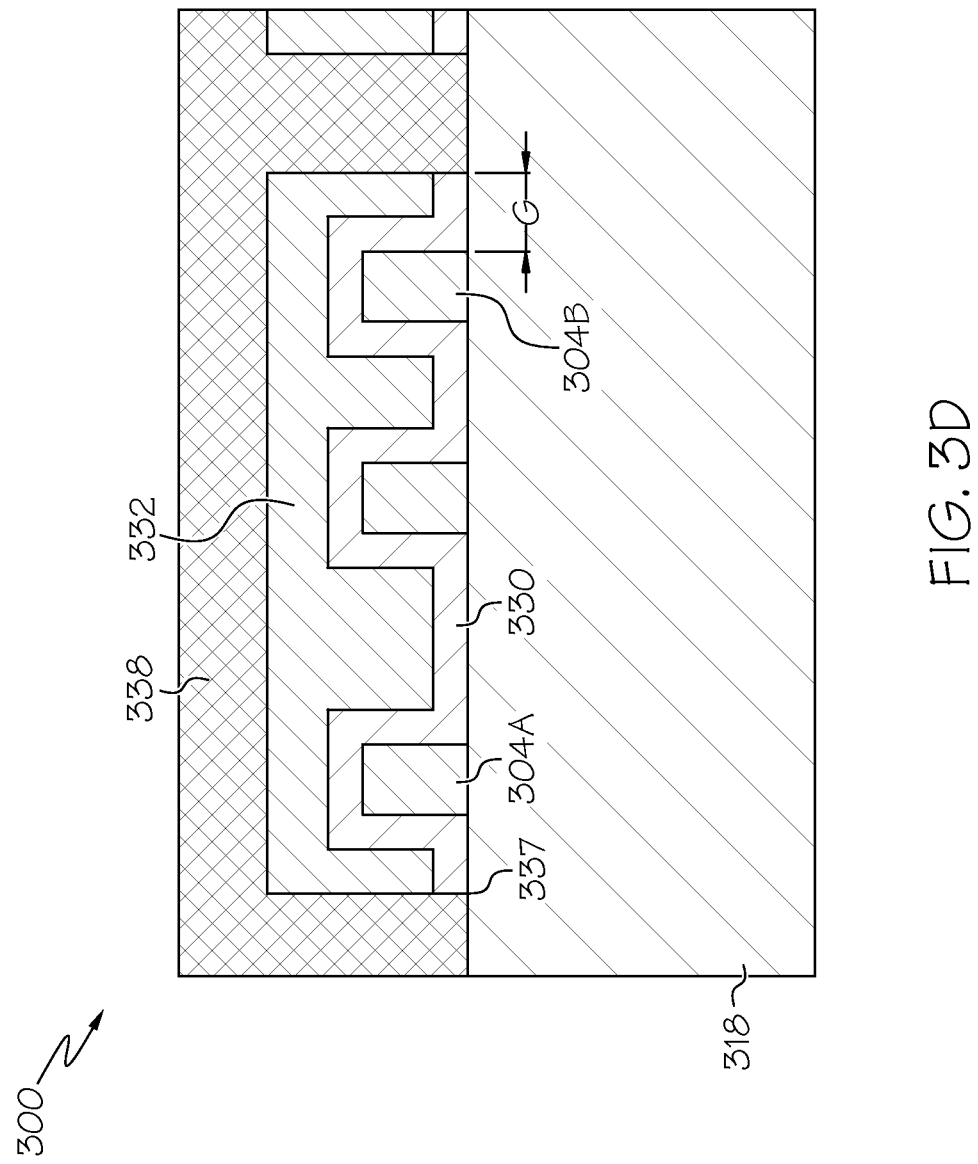

FIG. 3D shows a side view of a semiconductor structure after a subsequent process step of depositing a gate capping layer in accordance with illustrative embodiments.

Figure 4:
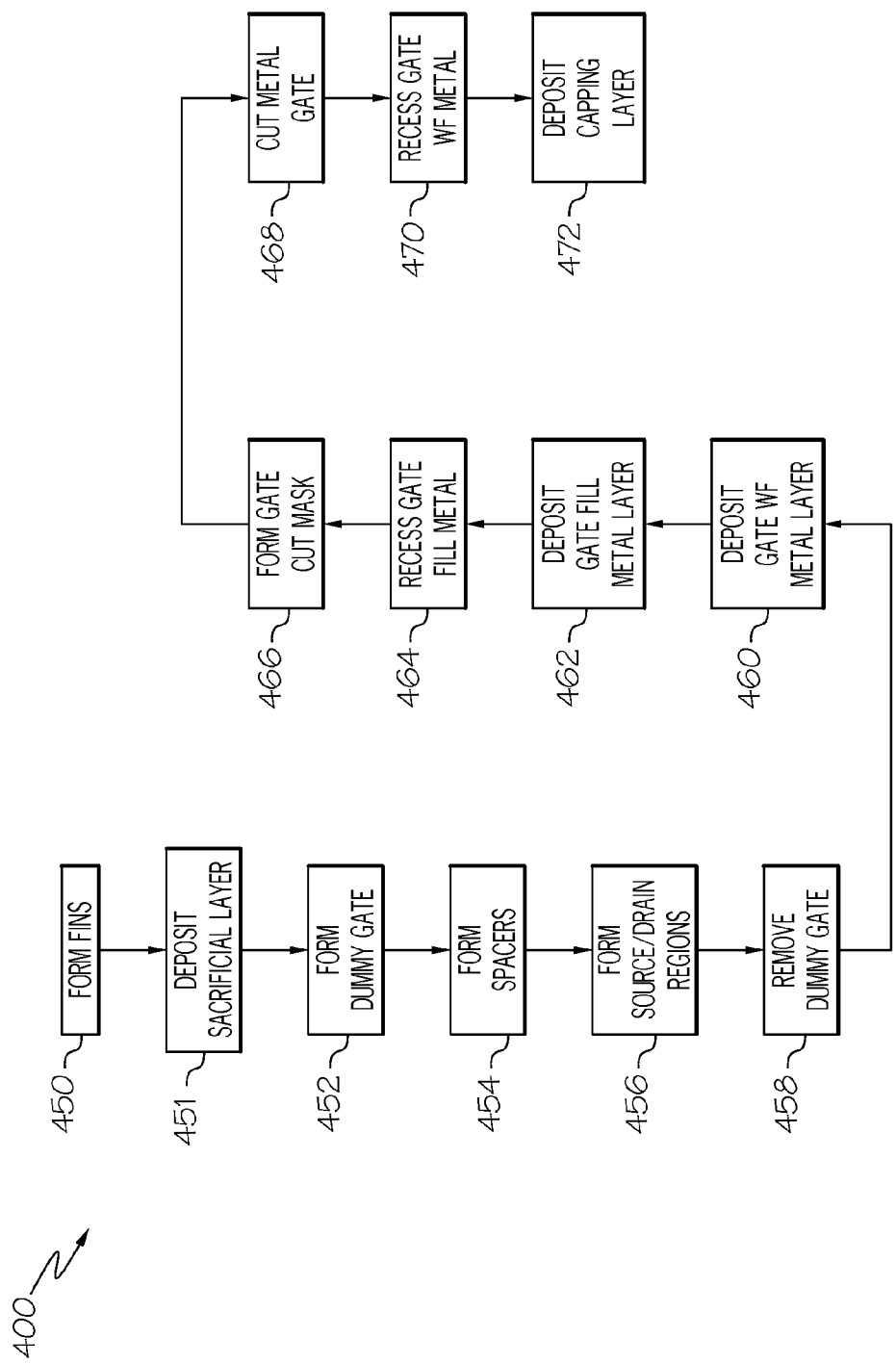

FIG. 4 shows a flowchart indicating process steps for embodiments of the present invention in accordance with illustrative embodiments.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIG. 1 shows a top-down view of a semiconductor structure 100 in accordance with embodiments of the present invention. Semiconductor structure 100 comprises semiconductor substrate 118. In embodiments, semiconductor substrate 118 comprises a silicon substrate. The substrate 118 may be a bulk substrate such as a silicon wafer. Alternatively, substrate 118 may be a thinner semiconductor-on-insulator (SOI) substrate. A plurality of fins 104 are formed on the semiconductor substrate 118. A plurality of gates 102 (indicated generally as 102) are formed on semiconductor substrate 118. Gate cut regions, indicated generally by reference 106, indicate regions where the gates 102 are to be cut (severed) at various locations to form independent transistors. The gate cut regions 106 may be represented in an EDA (Electronic Design Automation) system. The independent transistors may be connected together by local interconnect methods and/or back end of line (BEOL) metallization layers to form integrated circuits, such as SRAM devices. The EDA system may enforce a design rule that determines how much gate area is needed at the end of the device. For example, in the case of cut region 106A, a design rule may establish a distance of X between fin 104A and gate cut region 106A. This extra region of gate beyond the fin is referred to as the gate endcap. Gate endcap 107A has a distance X, as determined by the position of the gate cut region 106A. In some embodiments, distance X may range from about 20 nanometers to about 30 nanometers. It is desirable to reduce the gate endcap distance as much as possible. This can improve circuit density. In an application such as an SRAM device, where there are many similar transistors in an array, the improvement in density can be significant. However, there are challenges to reducing the gate endcap distance. In particular, the work function metal layer used in a metal gate stack can vary in thickness at the gate endcap, causing unwanted variation in the threshold voltage of the device. Embodiments of the present invention serve to mitigate this problem, while allowing a reduced gate endcap distance to improve circuit density while achieving reduced device variability. For example, gate endcap 107B has a distance Y between fin 104B and gate cut region 106B. In some embodiments, distance Y may range from about 5 nanometers to about 15 nanometers, which represents a considerable space savings compared to the gate endcap distance X of gate endcap 107A.

FIG. 2 shows a side view of a semiconductor structure 200 at a starting point for embodiments of the present invention (similar to as viewed along line A-A' of FIG. 1). Semiconductor structure 200 comprises semiconductor substrate 218. A plurality of fins (indicated generally as 204) are formed on the semiconductor substrate 218. A dummy gate 220 is formed on the substrate 218 and over the plurality of fins 204. In embodiments, the dummy gate 220 may be comprised of polysilicon. The dummy gate may start as a blanket layer of polysilicon, which is not yet cut, and thus has a length L which may be the length of an entire circuit block or die. In some embodiments, length L may range from about 2 millimeters to about 4 millimeters. In embodiments, the length L of the gate line is at least two orders of magnitude larger than a gate that has been cut. A sacrificial layer 224 is deposited on the blanket polysilicon. In embodiments, the sacrificial layer is comprised of silicon nitride. The blanket polysilicon is then formed on a dummy gate 220 by removing a portion of the blanket polysilicon. Spacers 226 are formed around the dummy gate 220. In embodiments, the spacers 226 are also comprised of silicon nitride. The spacers serve to protect the dummy gate 220 from any unwanted epitaxial growth or other damage during the fabrication process. The sacrificial layer 224 has a thickness D. In embodiments, the thickness D ranges from about 25 nanometers to about 35 nanometers. This is thinner than is possible with prior art methods. Since the dummy gate 220 is not yet cut, the spacers 226 are disposed only at the distal ends of the dummy gate 220. Thus, these spacers may be far away (at a nano scale) from where the actual devices will be formed. Hence, the thinner sacrificial layer 224 is possible, because if the spacers 226 get damaged and expose some of the dummy gate 220, it is only at the far ends of the dummy gate 220, and not near where functional circuits are formed. The ability to use a thinner sacrificial layer provides advantages during implantation, as it reduces undesirable shadow effects that can occur with a thicker (taller) sacrificial layer disposed on the dummy gate 220.

FIG. 3A shows a side view of a portion of a semiconductor structure 300 after subsequent process steps of depositing a metal gate stack 329 in accordance with illustrative embodiments. The metal gate stack 329 comprises a work function metal layer 330 and a metal gate layer 332. The metal gate layer 332 may be formed using a replacement metal gate (RMG) process. In such a process, the dummy gate 220 (FIG. 2) is selectively removed, and a metal gate stack is formed in the location where the dummy gate used to be. To form the metal gate stack 329, the work function metal layer 330 is conformally disposed on the fins 304, followed by a metal fill layer 332. In embodiments, the metal fill layer 332 may be comprised of tungsten. In embodiments, the work function metal layer 330 may comprise one or more metals. In some embodiments, the work function metal layer 330 may comprise titanium or a titanium-containing material. In some embodiments, the work function metal layer 330 may comprise aluminum or an aluminum-containing material.

FIG. 3B shows a side view of semiconductor structure 300 after a subsequent process step of forming a gate cut mask 334 in accordance with illustrative embodiments. The gate cut mask 334 may be formed using industry-standard patterning and lithographic techniques.

FIG. 3C shows a side view of semiconductor structure 300 after subsequent process steps of performing a gate cut and work function metal recess in accordance with illustrative embodiments. The gate cut and work function metal recess may utilize one or more anisotropic etch processes, such as a reactive ion etch process. As a result of the gate cut, voids 336 are formed in the gate metal fill layer 332 and work function metal layer 330.

FIG. 3D shows a side view of semiconductor structure 300 after a subsequent process step of depositing a gate capping layer 338 in accordance with illustrative embodiments. The capping layer 338 is disposed on the top and side portions of the gate stack. In embodiments, the capping layer 338 comprises silicon nitride. In other embodiments, the capping layer 338 comprises silicon oxide. In some embodiments (such as with a silicon nitride capping layer), the capping layer is deposited using an atomic layer deposition (ALD) process. In other embodiments (such as with a silicon oxide capping layer), the capping layer is deposited using a spin-on deposition process. As can be seen in FIG. 3D, the work function metal layer 330 terminates at the capping layer 338 on the semiconductor substrate 318, as indicated by termination boundary 337. This arrangement provides a consistent shape for work function metal layer 330 with relation to the outermost fins (304A and 304B). With the consistent shape, the threshold voltage Vt of transistors formed using fin 304A and 304B is consistent, while the gate endcap distance is significantly reduced over prior art methods, providing an improvement in circuit density. Note that while the examples illustrated in FIGS. 3A-3D show multiple fins, embodiments of the present invention may also be utilized with finFETs having a single fin. Single-fin finFET devices are used in a variety of applications, such as SRAM chips, which may contain hundreds of millions of single-fin finFET devices. Thus, embodiments of the present invention, which allow a reduced gate endcap distance for each finFET, can provide a considerable improvement in circuit density for an SRAM device. In addition, in logic cell boundaries and n-p well boundaries, the ability to reduce the gate endcap distance also allows reduction in these boundary distances and offers considerable improvement in overall logic density. In some embodiments, the capping layer 338 disposed on the side portions of the gate stack is disposed at a distance G from the fin 304B, where G ranges from about 5 nanometers to about 15 nanometers. This is a considerable improvement as compared to prior art devices and techniques.

FIG. 4 shows a flowchart 400 indicating process steps for embodiments of the present invention in accordance with illustrative embodiments. In process step 450, semiconductor fins are formed on a semiconductor substrate. The semiconductor fins may be formed of silicon, silicon germanium, or other suitable material. The semiconductor fins may be formed using a sidewall image transfer (SIT) technique, or other suitable technique. In process step 451, a sacrificial protective layer is deposited on a blanket dummy gate material. In embodiments, the sacrificial protective layer is silicon nitride and the blanket dummy gate material is polysilicon. In process step 452, a dummy gate is formed by removing a portion of the blanket polysilicon. In embodiments, in subsequent process steps, the dummy gate is replaced with a metal gate stack using a replacement metal gate (RMG) process. The dummy gate may be fairly long (on the order of millimeters), and is not cut at this time. In process step 454, spacers are formed adjacent to the dummy gate. The spacers may be comprised of silicon nitride, and may be deposited via a chemical vapor deposition (CVD) process, or other suitable process. In process step 456, source/drain regions are formed. This may include introducing dopants, formation of epitaxial regions, silicide regions, and other process steps in accordance with industry-standard procedures. In process step 458, the dummy gate is removed. In embodiments, this may be performed using a selective etch process that is selective to polysilicon. In process step 460, a work function metal layer is deposited. In embodiments, the work function metal layer may include more than one metal sublayer. In embodiments, the work function metal layer contains titanium. In other embodiments, the work function metal layer may contain aluminum. Other work function metal layer materials are possible. In process step 462, a gate fill metal layer is deposited. In embodiments, the gate fill metal layer is comprised of tungsten. Other gate fill metal layers, such as aluminum and/or copper are possible. In process step 464, the gate metal may be recessed to an appropriate height for the gate. In process step 466, a gate cut mask is formed on the gate fill metal layer. In process step 468, the gate fill metal is cut. This may be performed using a selective anisotropic etch process for the fill metal, such as a reactive ion etch. In process step 470, if necessary, the work function metal is recessed such that it is flush with the gate fill metal layer. In process step 472, a gate capping layer is deposited on the tops and sides of the gate. The work function metal terminates at the capping layer on the semiconductor substrate.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
    forming a dummy gate on a semiconductor substrate;
    depositing a sacrificial layer on the dummy gate;
    forming spacers adjacent to the dummy gate;
    removing the dummy gate and sacrificial layer;
    depositing a work function metal layer;
    depositing a fill metal layer;
    performing a gate cut through the fill metal layer and the work function metal layer, whereby an upper surface of the semiconductor substrate is exposed; and
    depositing a gate capping layer.

2. The method of claim 1, wherein depositing a gate capping layer comprises depositing a silicon nitride layer.

3. The method of claim 2, wherein depositing a gate capping layer is performed using an atomic layer deposition process.

4. The method of claim 1, wherein depositing a fill metal layer comprises depositing tungsten.

5. The method of claim 1, wherein depositing a work function metal layer comprises depositing titanium.

6. The method of claim 1, wherein depositing a work function metal layer comprises depositing aluminum.

7. The method of claim 1, wherein forming a dummy gate on a semiconductor substrate comprises depositing polysilicon.

8. The method of claim 1, wherein depositing a sacrificial layer on the dummy gate comprises depositing a silicon nitride layer.

9. The method of claim 8, wherein depositing a silicon nitride layer comprises depositing a silicon nitride layer having a thickness ranging from about 25 nanometers to about 35 nanometers.

* * * * *